United States Patent
Toivonen et al.

(10) Patent No.: US 9,379,669 B2
(45) Date of Patent: Jun. 28, 2016

(54) METHOD FOR CLASS-B AMPLIFIER MISMATCH CORRECTION

(71) Applicant: Telefonaktiebolaget L M Ericsson (publ), Stockholm (SE)

(72) Inventors: Ossi Toivonen, Halikko (FI); Sami Vilhonen, Lieto (FI)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 37 days.

(21) Appl. No.: 14/277,388

(22) Filed: May 14, 2014

(65) Prior Publication Data

US 2015/0333704 A1 Nov. 19, 2015

(51) Int. Cl.

| | |
|---|---|
| H03F 3/04 | (2006.01) |
| H03F 1/02 | (2006.01) |
| H03F 3/19 | (2006.01) |
| H03F 3/21 | (2006.01) |
| H03F 1/32 | (2006.01) |
| H03F 3/189 | (2006.01) |
| H03F 3/24 | (2006.01) |
| H03F 3/45 | (2006.01) |
| H03F 3/72 | (2006.01) |

(52) U.S. Cl.
CPC ............ *H03F 1/0222* (2013.01); *H03F 1/0277* (2013.01); *H03F 1/32* (2013.01); *H03F 3/189* (2013.01); *H03F 3/19* (2013.01); *H03F 3/21* (2013.01); *H03F 3/211* (2013.01); *H03F 3/245* (2013.01); *H03F 3/45475* (2013.01); *H03F 3/72* (2013.01); *H03F 2200/27* (2013.01); *H03F 2200/336* (2013.01); *H03F 2200/555* (2013.01); *H03F 2203/21127* (2013.01); *H03F 2203/21178* (2013.01); *H03F 2203/7236* (2013.01)

(58) Field of Classification Search
CPC . H03F 1/0261; H03F 2200/451; H03F 3/211; H03F 3/24
See application file for complete search history.

(56) References Cited

U.S. PATENT DOCUMENTS

| | | | |
|---|---|---|---|
| 7,656,227 B1 | 2/2010 | Beaudoin et al. | |
| 7,768,353 B2 | 8/2010 | Chang et al. | |
| 8,594,233 B2 | 11/2013 | Muhammad | |
| 2011/0210795 A1* | 9/2011 | Ohta | H03F 1/0266 330/288 |
| 2012/0071159 A1 | 3/2012 | Akhi et al. | |
| 2012/0088510 A1 | 4/2012 | Akhi et al. | |
| 2012/0302186 A1 | 11/2012 | Jones et al. | |

FOREIGN PATENT DOCUMENTS

| | | |
|---|---|---|
| EP | 1367710 A1 | 12/2003 |
| EP | 1387485 A1 | 2/2004 |
| EP | 2582038 A1 | 4/2013 |
| WO | 2004054095 A1 | 6/2004 |

* cited by examiner

*Primary Examiner* — Sibin Chen
(74) *Attorney, Agent, or Firm* — Coats & Bennett, PLLC

(57) ABSTRACT

A calibration solution for a power amplifier array comprising a plurality of amplifier cells is presented that improves the linearity and efficiency of the power amplifier, especially when only a small number of the amplifier cells are active. To that end, a bias control word is selected from a predetermined bias table for each of the active power amplifier cells. An average of the selected bias control words is then used to bias an input stage of each active power amplifier cell. The solution presented herein provides techniques for determining the bias control words, as well as using the bias control words.

12 Claims, 9 Drawing Sheets

METHOD FOR CLASS-B AMPLIFIER MISMATCH CORRECTION

The solutions disclosed herein relate generally to power amplifiers, and more particularly to improving the efficiency and linearity of power amplifiers.

BACKGROUND

The performance of a wireless transceiver relies heavily on the performance, e.g., linearity, efficiency, etc., of the amplifiers used by the wireless transceiver to amplify signals, e.g., for subsequent transmission. To achieve good power efficiency and linearity, a power amplifier may comprise a plurality of amplifier cells that each operate as B-class amplifiers. For example, the input bias point for each amplifier cell is typically set close to the amplifier cut-off to achieve a high linearity across the entire input voltage range characteristic of B-class operation. Typical B-class amplifier cells, however, are sensitive to process variations. For example, process variations incurred during the manufacture of the amplifier cells cause large gain step variations between amplifier cells, especially when operating with low gain levels (e.g., due to a small input signal and/or due to the power amplifier having only a small number of active amplifier cells.

Conventional solutions to this problem may adjust, for example, the bias point of the active power amplifier cells such that they operate as an A-class amplifier when operating with low gain levels. In so doing, the conventional solution improves the linearity of the power amplifier for these low gain level situations. However, because A-class power amplifiers are significantly less efficient than B-class power amplifiers, this conventional solution increases the already problematic efficiency problems.

Thus, there remains a need for improved power amplifier solutions that achieve a desired linearity and efficiency even when operating with low gain levels.

SUMMARY

The solution disclosed herein improves the linearity and efficiency of a power amplifier comprising a plurality of amplifier cells, especially when only a small number of the plurality of amplifier cells is active. To that end, a bias control word is selected from a predetermined bias table for each of the active amplifier cells. An average of the selected bias control words is then used to bias an input stage of each active amplifier cell.

One exemplary embodiment provides a method of reducing gain step error and improving linearity of a plurality of power amplifiers, wherein an operational point of each power amplifier during the operational phase is set such that an average amplifier current increases with increasing amplitude of an RF signal applied to the input stage of the power amplifier. The method comprises identifying which one or more of the plurality of power amplifiers are active during an operational phase of the plurality of power amplifiers. The method further comprises selecting a bias control word corresponding to each identified active power amplifier from a bias table, the bias table comprising a bias control word for each power amplifier, averaging the selected bias control words to determine an input bias control word, and biasing an input stage of each active power amplifier according to the input bias control word.

In another exemplary embodiment, a bias circuit reduces a gain step error and improves a linearity of a plurality of power amplifiers. An operational point of each power amplifier during the operational phase is set such that an average amplifier current increases with increasing amplitude of an RF signal applied to the input stage of the power amplifier. The bias circuit comprises a configuration circuit and a selection circuit. The configuration circuit is configured to identify which one or more of the plurality of power amplifiers are active during an operational phase of the plurality of power amplifiers. The a selection circuit is configured to select a bias control word corresponding to each identified active power amplifier from a bias table, the bias table stored in a memory operatively connected to the bias circuit and comprising a bias control word for each power amplifier. The selection circuit is further configured to average the selected bias control words to determine an input bias control word and bias an input stage of each active power amplifier according to the input bias control word.

Another exemplary embodiment provides an amplifier system comprising a plurality of power amplifiers, a memory, and a bias circuit. An operational point of each power amplifier during the operational phase is set such that an average amplifier current increases with increasing amplitude of an RF signal applied to the input stage of the power amplifier. The memory is configured to store a bias table comprising a bias control word for each of the plurality of power amplifiers. The bias circuit is configured to reduce a gain step error and improve a linearity of the plurality of power amplifiers. The bias circuit comprises a configuration circuit and a selection circuit. The configuration circuit is configured to identify which one or more of the plurality of power amplifiers are active during the operational phase of the plurality of power amplifiers. The selection circuit is configured to select the bias control word corresponding to each identified active power amplifier from the bias table. The selection circuit is further configured to average the selected one or more bias control words to determine an input bias control word and bias an input stage of each active power amplifier according to the input bias control word.

Another exemplary embodiment provides a method of generating one or more bias tables for a plurality of power amplifiers. An operational point of each power amplifier during the operational phase is set such that an average amplifier current increases with increasing amplitude of an RF signal applied to the input stage of the power amplifier. The method comprises determining an optimal bias control that optimizes a linearity of the plurality of power amplifiers when all power amplifiers are active, generating an initial bias table comprising an initial bias control word for each power amplifier determined when only that power amplifier is active, and generating the one or more bias tables based on the optimal bias control word and the initial bias table.

In another exemplary embodiment, calibration system is configured to generate one or more bias tables for a plurality of power amplifiers. An operational point of each power amplifier during the operational phase is set such that an average amplifier current increases with increasing amplitude of an RF signal applied to the input stage of the power amplifier. The calibration system comprises an optimization circuit and a bias calibration circuit. The optimization circuit is configured to, when all power amplifiers are active, determine an optimal bias control word that optimizes a linearity of the plurality of power amplifiers. The bias calibration circuit is configured to generate an initial bias table comprising an initial bias control word for each power amplifier determined when only that power amplifier is active, and generate the one or more bias tables based on the optimal bias control word and the initial bias table.

BRIEF DESCRIPTION OF THE DRAWINGS

FIG. 2A shows the input bias current for two different cases for each of a plurality of amplifier cells. FIG. 2B shows gain step variations (in transconductance) for each of the two cases. FIG. 2C shows gain step variations (in dBs) for each of the two cases.

DETAILED DESCRIPTION

Controlling the linearity and efficiency of a power amplifier in a transceiver is critical to improving the performance of the transceiver as a whole. As used herein the term "power amplifier" refers to any amplifier that outputs more power than applied at the input. In some embodiments, the power amplifier may comprise a pre-power amplifier (e.g., an amplifier used before additional amplification to boost an input signal power without degrading the signal-to-noise ratio), an amplifier cell in a power amplifier array of amplifier cells (e.g., an array of pre-power amplifier cells), the last amplifier before the antenna of a wireless transceiver, etc. It will be appreciated, however, that the power amplifier discussed herein could be any amplifier used to increase the power of an input signal.

Figure 1:
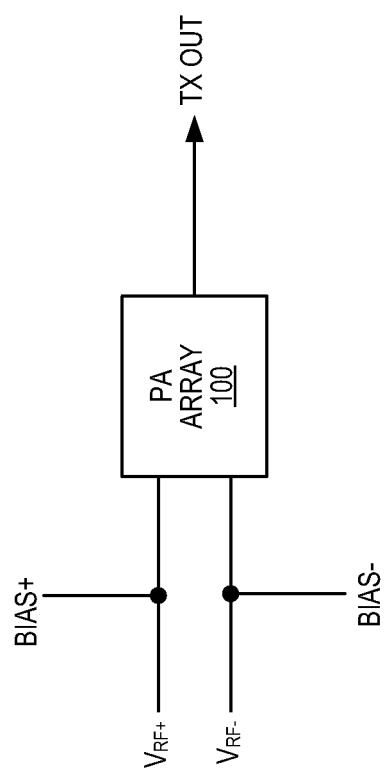
FIG. 1 shows a block diagram for a basic power amplifier array.
Figure 3:
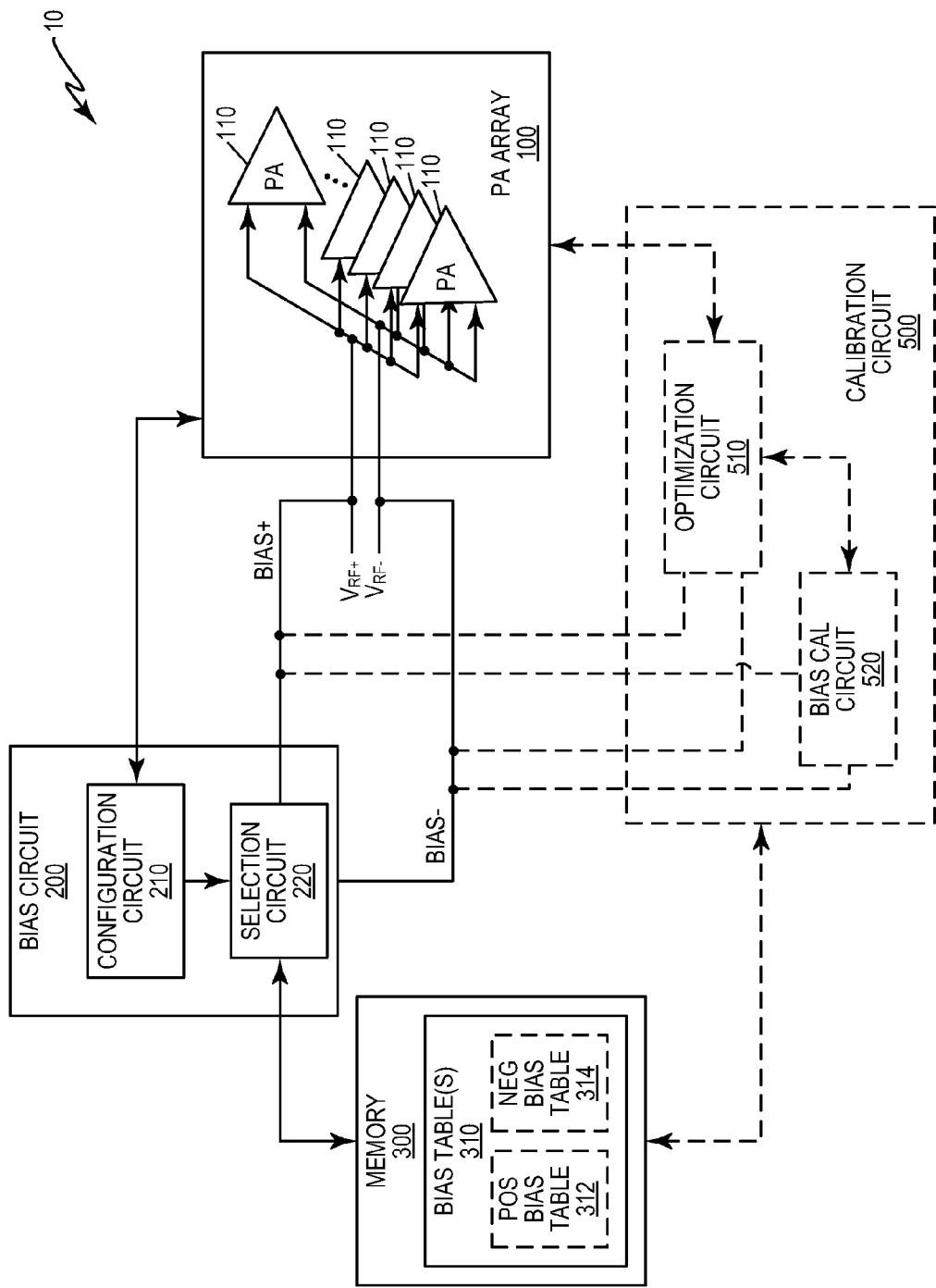
FIG. 3 shows a block diagram of an amplifier system including a power amplifier array, a bias circuit, and a calibration circuit according to one exemplary embodiment.

FIG. 1 shows a basic block diagram of a power amplifier (PA) array 100 suitable for a wireless transmitter, where the PA array 100 comprises a plurality of power amplifiers, also referred to herein as amplifier cells 110 (e.g., as shown in FIG. 3). PA array 100 activates one or more of the amplifier cells 110 depending on the signal strength requirements of the transmitter output signal (TX OUT). The positive and negative input stages of each active amplifier cell are biased according to positive and negative bias words, respectively. Exemplary amplifier cells 110 include class B, class AB, and class C amplifier cells, where an operational point of each amplifier cell 110 is set such that the average amplifier current increases with increasing amplitude of an RF input signal applied to an input stage of the amplifier cell 110.

The effects of manufacturing process variations cause a relatively high (and undesirable) gain step variation between the amplifier cells 110. When a large number of amplifier cells 110 of the PA array 100 are active, this gain step variation has only a minor impact on the linearity and efficiency of the PA array 100. When only a small number (e.g., less than a third) of the amplifier cells 110 are active, however, the gain step variation can have a significant negative effect on the overall performance of the PA array 100. The solution disclosed herein seeks to reduce the effects of the gain step variation between the active amplifier cells 110, and thus to improve the linearity and efficiency.

Figure 2A:
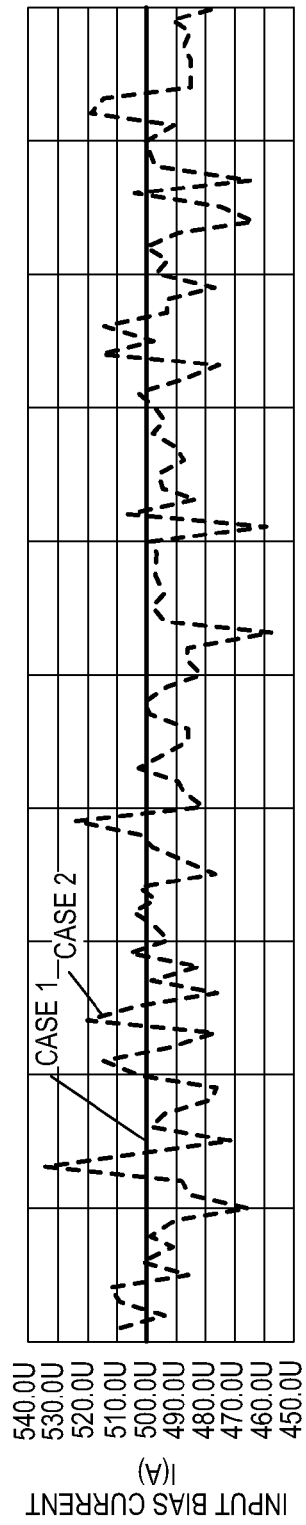
FIGS. 2A-2C show simulation results demonstrating gain step variations associated with conventional power amplifier arrays.
Figure 2B:
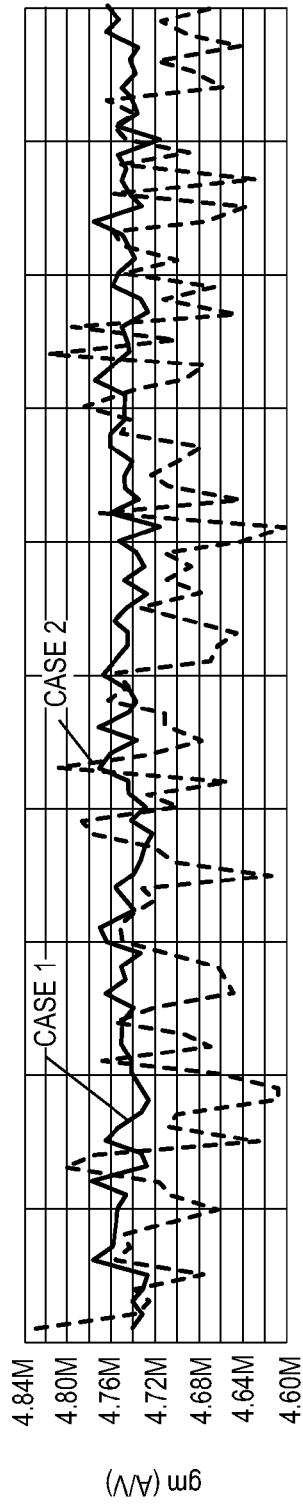
Figure 2C:
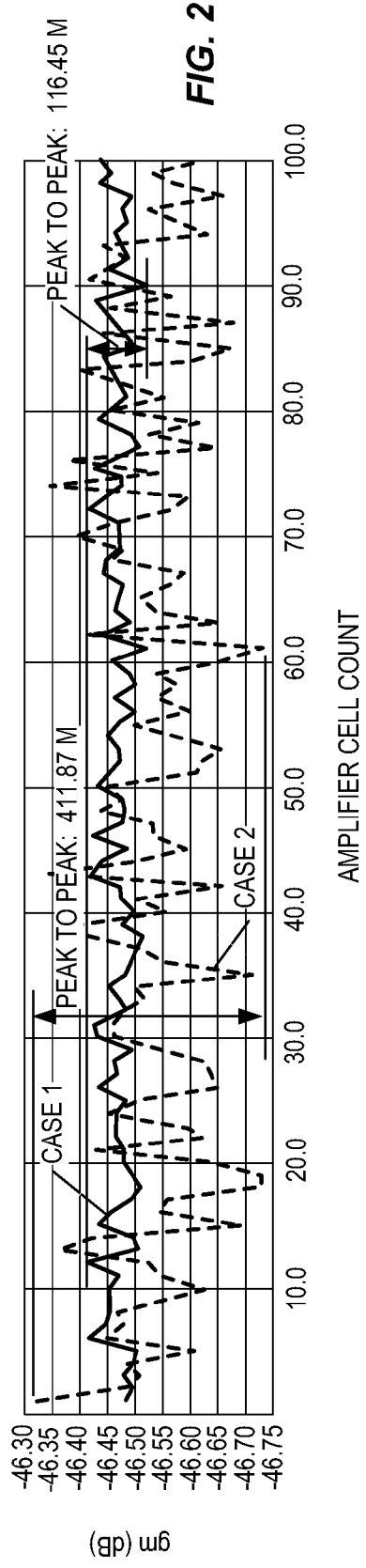

FIGS. 2A-2C demonstrate the gain step variations between 100 different amplifier cells 110 when the input bias current is kept constant (Case 1, FIG. 2A) and when the input voltage is kept constant (Case 2). Case 2 results in a significant input bias current variation as shown in FIG. 2A. FIG. 2B shows the Case 1 and Case 2 gain step variations by showing the transconductance for each of the 100 different amplifier cells 110, while FIG. 2C provides the same data in dBs. As shown in FIGS. 2B and 2C, the gain step variation is less when the input bias current is kept constant (Case 1) than it is when the input bias voltage is kept constant (Case 2). FIGS. 2A-2C therefore demonstrate the desirability of maintaining the same average bias current per unit cell across the entire gain range. This is especially helpful when the number of active amplifier cells 110 is small, as this scenario tends to exacerbate the gain step variation problem.

FIG. 3 shows an exemplary block diagram for an amplifier system 10 comprising a bias circuit 200, and corresponding memory 300, operatively connected to the PA array 100. Bias circuit 200 biases the input stage of each active amplifier cell 110 in the PA array 100 so as to reduce the gain step error, and therefore to improve the linearity and efficiency of the PA array 100. To that end, bias circuit 200 comprises configuration circuit 210 and selection circuit 220. The configuration circuit 210 identifies which of the amplifier cells 110 in the PA array 100 are active during an operational phase of the amplifier system 10. Memory 300 stores one or more bias tables 310, where each bias table includes a predetermined bias control word for each amplifier cell 110. Selection circuit 220 determines and applies the appropriate bias control word to the input stage of each active amplifier cell 110 based on the bias control words in the bias table(s).

Figure 4:
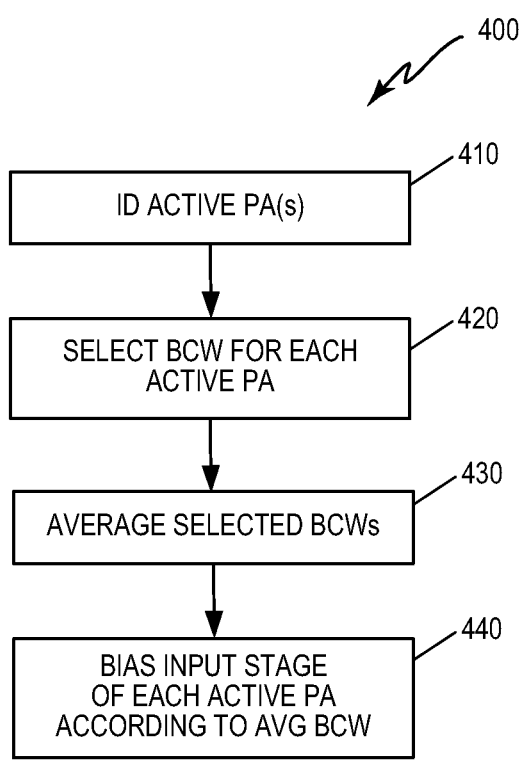
FIG. 4 shows an exemplary method for biasing the active amplifier cells of the power amplifier array of FIG. 3.

FIG. 4 shows an exemplary method 400 executed by the bias circuit 200. The configuration circuit 210 identifies which of the amplifier cells 110 in the PA array 100 are active during an operational phase of the PA array 100 (block 410). The selection circuit 220 selects the bias control word from the corresponding bias table 310 for each identified active amplifier cell 110 (block 420), averages the selected bias control word to determine an input bias control word (block 430), and biases the input stage of each active amplifier cell 110 according to the input bias control word (block 440).

For example, assume PA array 100 includes thirty-two amplifier cells 110, and configuration circuit 210 identifies the first, fifth, and tenth amplifier cells 110 as active. Selection circuit 220 selects the bias control words corresponding to the first, fifth, and tenth amplifier cells 110 from bias table(s) 310, e.g., BCW (1), BCW (5), and BCW (10). The selection circuit 220 then averages the selected bias control words to determine the input bias control word ($BCW_{input}$), e.g., $BCW_{input} = \frac{1}{3}(BCW (1) + BCW (5) + BCW (10))$, and uses the input bias control word to bias each input stage of the first, fifth, and tenth amplifier cells 110.

For embodiments where each amplifier cell 110 comprises a positive half-cell 112 and a negative half-cell 114 (FIG. 6), memory 300 stores a positive half-cell bias table 312 and a negative half-cell bias table 314. The positive half-cell bias table 312 stores a predetermined bias control word for the positive half-cell 112 of each amplifier cell 110, and the negative half-cell bias table 314 stores a predetermined bias control word for the negative half-cell 114 of each amplifier cell 110. Using the same example as above, the selection circuit 220 selects the bias control words corresponding to positive half-cells 112 for the first, fifth, and tenth amplifier cells 110 from the positive half-cell bias table 312, e.g., $BCW_p(1)$, $BCW_p(5)$, and $BCW_p(10)$, and selects the bias control words corresponding to the negative half-cells 114 for the first, fifth, and tenth amplifier cells 110 from the negative half-cell bias table 312, e.g., $BCW_n(1)$, $BCW_n(5)$, and $BCW_n(10)$. The selection circuit 220 then averages the selected positive half-cell bias control words to determine the positive half-cell input bias control word ($BCW_{input,p}$), e.g., $BCW_{input,p}=\frac{1}{3}(BCW_p(1)+BCW_p(5)+BCW_p(10))$, and uses the positive half-cell input bias control word to bias the input stage of the positive half-cell 112 of each of the first, fifth, and tenth amplifier cells 110. Similarly, the selection circuit 220 averages the selected negative half-cell bias control words to determine the positive half-cell input bias control word ($BCW_{input,n}$) e.g., $BCW_{input,n}=\frac{1}{3}(BCW_n(1)\ BCW_n(5)+BCW_n(10))$, and uses the negative half-cell input bias control word to bias the input stage of the negative half-cell 114 of each of the first, fifth, and tenth amplifier cells 110.

More generally, if j of the M amplifier cells 110 are active, the selection circuit 220 determines the positive half-cell input bias control word according to:

$$BCW_{input,p} = \frac{1}{j}\sum_{i=1}^{j} BCW_p(i), \quad (1)$$

and determines the negative half-cell input bias control word according to:

$$BCW_{input,n} = \frac{1}{j}\sum_{i=1}^{j} BCW_n(i). \quad (2)$$

Selection circuit 220 then, for each active amplifier cell 110, applies the determined positive half-cell input bias control word $BCW_{input,p}$ to the input stage of each positive half-cell 112, and applies the determined negative half-cell input bias control word $BCW_{input,n}$ to the input stage of each negative half-cell 114.

The above solution is described in terms of a basic PA array 100 comprising a plurality of amplifier cells 110. In some embodiments, a first half of the amplifier cells 110 in the PA array 100 comprise In-phase amplifier cells 110 configured to amplify In-phase radio frequency (RF) signals, while a second half of the amplifier cells 110 in the PA array 100 comprise Quadrature amplifier cells 110 configured to amplify Quadrature RF signals. In this case, memory 300 stores at least one In-phase bias table 310, each of which comprises an In-phase bias control word for each of the In-phase amplifier cells 110. Similarly, memory 300 stores at least one Quadrature bias table 310, each of which comprises a Quadrature bias control word for each of the Quadrature amplifier cells 110. The selection circuit 220 then selects the bias control words for the active In-phase and/or Quadrature amplifier cells 110 from the In-phase and Quadrature bias tables 310. Selection circuit 220 biases the active In-phase amplifier cells 110 according to an input In-phase bias control word determined by averaging the selected In-phase bias control words. Similarly, the selection circuit 220 biases the active Quadrature amplifier cells 110 according to an input Quadrature bias control word determined by averaging the selected Quadrature bias control words.

Further, if the In-phase and Quadrature amplifier cells 110 have positive and negative half-cells, additional bias tables 310 are stored in memory 300 for the positive and negative half-cells. More particularly, memory 300 may include:

a positive In-phase bias table comprising a bias control word for each positive half-cell 112 of each In-phase amplifier cell 110;

a negative In-phase bias table comprising a bias control word for each negative half-cell 114 of each In-phase amplifier cell 110;

a positive Quadrature bias table comprising a bias control word for each positive half-cell 112 of each Quadrature amplifier cell 110; and a negative Quadrature bias table comprising a bias control word for each negative half-cell 114 of each Quadrature amplifier cell 110;

In this case, the selection circuit 220 selects and averages the appropriate bias control words from the appropriate bias tables for each active amplifier cell 110.

The bias control words stored in the bias table(s) 310 are predetermined, and thus available for use during the amplifier system's operational phase. In one embodiment, such bias control words are predetermined during a calibration phase. Such a calibration phase typically occurs before the operational phase. During the calibration phase, a calibration circuit 500 (FIG. 3) is operatively connected to the PA array 100 and memory 300 to determine and store each bias control word for each bias table 310 in memory 300.

FIG. 3 shows a block diagram of one exemplary calibration circuit 500 comprising an optimization circuit 510 and a bias calibration circuit 520. Optimization circuit 510 determines an optimal bias control word when all amplifier cells 110 are active, where the optimal bias control word optimizes the linearity of the amplifier cells 110. The bias calibration circuit 520 generates an initial bias control word for each of the amplifier cells 110 when only that amplifier cell 110 is active, and determines the bias control word for that amplifier cell 110 based on the initial bias control word and the optimal bias control word. The bias control word for the active amplifier cell 110 is then stored in the corresponding bias table 310 in memory 300. The bias calibration circuit 520 repeats this process for each of the amplifier cells 110.

Figure 5A:
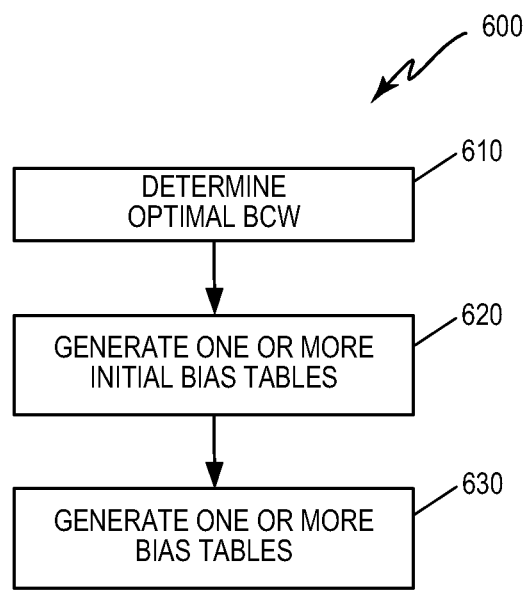
FIG. 5A shows an exemplary method for generating the bias table(s) used to bias the active amplifier cells.
Figure 5B:
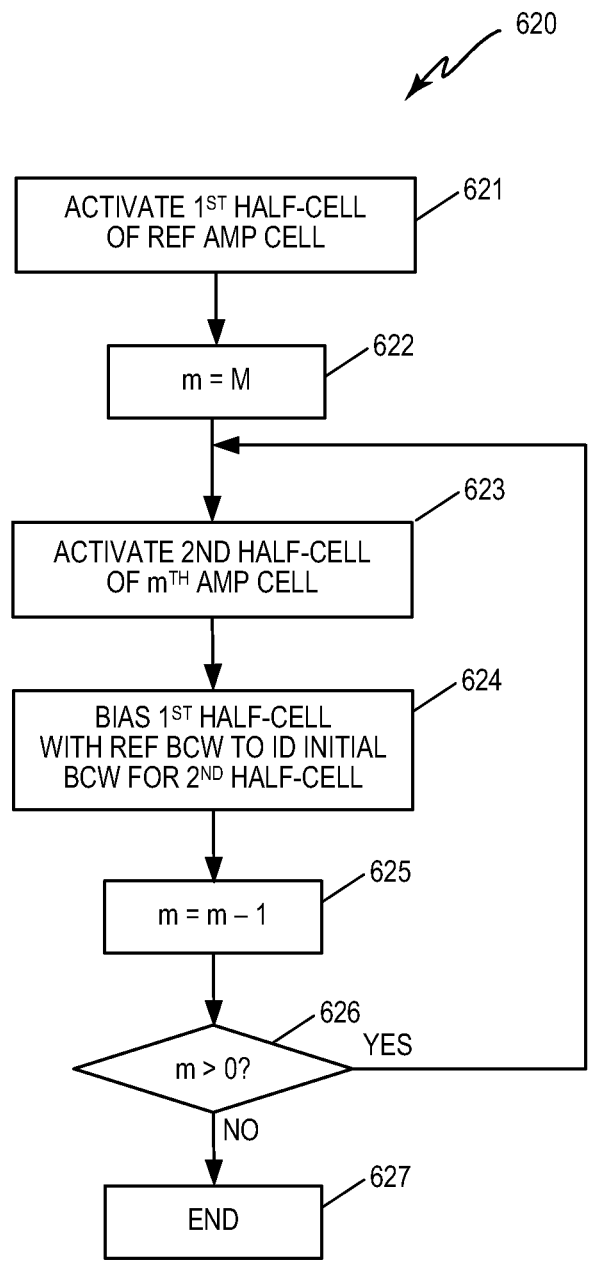
FIG. 5B shows an exemplary method for generating the initial bias table(s) used to generate the bias table(s).

FIGS. 5A and 5B show exemplary processes executed by the calibration circuit 500 to generate the positive and negative half-cell bias tables 312, 314 stored in memory 300. It will be appreciated the calibration process does not require the steps shown in FIG. 5A or 5B be executed in the order shown in FIGS. 5A and 5B.

FIG. 5A shows one exemplary process executed by the calibration circuit 500. The optimization circuit 510 determines the optimal bias control word for each of the positive and negative half-cells 312, 314 (block 610). The bias calibration circuit 520 generates one or more initial bias tables (block 620), where each initial bias table comprises an initial bias control word for one of the plurality of amplifiers determined when only that power amplifier is active. The bias calibration circuit 520 also generates one or more bias tables based on the optimal bias control word and the one or more initial bias tables (block 630).

For example, the optimization circuit 510 may determine the optimal bias control word by activating all of the amplifier cells 110 in the PA array 100 and identifying the bias control word that optimizes the linearity of the output of the PA array 100. For example, optimization circuit 510 may sequentially step the positive half-cell bias control words used to bias the input stage of the positive half-cell 112 of each amplifier cell 110, sequentially step the negative half-cell bias control words used to bias the input stage of the negative half-cell 114 of each amplifier cell 110, and measure the output of each amplifier cell 110, e.g., using an on-chip measurement receiver, for each applied bias control word. The optimization circuit 510 then selects the positive and negative half-cell bias control words that produced the most linear output as the optimal bias control word for the positive and negative half-cells 112, 114. After the optimization circuit 510 finishes, the calibration circuit 500 deactivates the amplifier cells 110.

FIG. 5B shows one exemplary process 620 for generating the initial bias table(s), where each amplifier cell 110 includes a positive half-cell 112 and negative half-cell 114. To that end, bias calibration circuit 520 activates a first half-cell, e.g., the negative half-cell 114, of one of the amplifier cells 110 (block 621), e.g., a reference amplifier cell, and initializes a counter m to M (block 622), where the PA array 100 includes M amplifier cells 110. The bias calibration circuit 520 then activates the other (second) half-cell of the $m^{th}$ amplifier cell 110, e.g., the positive half-cell 112 (block 623). It will be appreciated that the counter m of FIG. 5B represents only one way to sequentially determine the initial bias control words for each amplifier cell 110. Other ways may alternately be used. For example, m may be initialized to zero, and subsequently may be incremented.

The bias calibration circuit 520 then biases the input stage of the negative half-cell 114 of the reference amplifier cell 110 according to a reference bias control word, while varying a bias control word used to separately bias the input stage of the active positive half-cell 112 (while all other positive half-cells 112 are inactive) until the output of the biased positive half-cell 112 matches that of the reference-biased negative half-cell 114 (block 624). Each bias control word that produces a positive half-cell output matching that of the reference-biased negative half-cell 114 is identified as an initial bias control word for the corresponding positive half-cell 112. The active positive half-cell 112 of the $m^{th}$ amplifier cell $110_m$ is then deactivated, m is decremented (block 625), and the process repeats for the positive half-cell 112 of the next amplifier cell (blocks 623-625), e.g., the $(m-1)^{th}$ amplifier cell $110_{m-1}$, until m=0 (blocks 626 and 627).

For example, the m=1 amplifier cell 110 may be used as the reference amplifier cell, such that the negative half-cell 112 of the m=1 amplifier cell 110 is biased according to the reference bias control word; all other negative half-cells 114 are inactive. The bias control word that produces a positive half-cell output for the m=1 amplifier cell 110 matching that of the reference-biased negative half-cell 114 when all other positive half-cells are inactive is identified as an initial bias control word for the positive half-cell 112 of the m=1 amplifier cell. The bias control word that produces a positive half-cell output for the positive half-cell 112 of the m=2 amplifier cell 110 matching that of the reference-biased negative half-cell 114 (of the m=1 amplifier cell 110) when all other positive half-cells are inactive is identified as an initial bias control word for the positive half-cell 112 of the m=2 amplifier cell 110. This process continues until the initial bias control word is determined for each positive half-cell 112.

The bias calibration circuit 520 does a similar process to determine the initial bias control word for each negative half-cell 112. In this case, the "first" half-cell is the positive half-cell 112 of the reference amplifier cell 110, and the "second" half-cell is the negative half-cell 114 of any one of the amplifier cells 110. More particularly, the bias calibration circuit 520 activates the first half-cell, e.g., the positive half-cell 112, of one of the amplifier cells 110 (block 621), e.g., a reference amplifier cell, and initializes the counter m to M (block 622). The bias calibration circuit then activates the other (second) half-cell of the $m^{th}$ amplifier cell 110, e.g., the positive half-cell 112 (block 623). Bias calibration circuit 520 then biases the input stage of the positive half-cell 112 of the reference amplifier cell according to the reference bias control word, while varying a bias control word used to separately bias the input stage of the active negative half-cell 114 (when all other negative half-cells 114 are inactive) until the output of the biased negative half-cell 114 matches that of the reference-biased positive half-cell 112 (block 624). Each bias control word that produces a negative half-cell output matching that of the reference-biased positive half-cell 112 is identified as an initial bias control word for the corresponding negative half-cell 114. The active negative half-cell 114 of the $m^{th}$ amplifier cell $110_m$ is then deactivated, m is decremented (block 625), and the process repeats for the negative half-cell 114 of the next amplifier cell (blocks 623-625), e.g., the $(m-1)^{th}$ amplifier cell $110_{m-1}$, until m=0 (blocks 626 and 627).

For example, the m=1 amplifier cell 110 may be used as the reference amplifier cell, such that the positive half-cell 114 of the m=1 amplifier cell 110 is biased according to the reference bias control word; all other positive half-cells 112 are inactive. The bias control word that produces a negative half-cell output for the m=1 amplifier cell 110 matching that of the reference-biased positive half-cell 114 when all other positive half-cells are inactive is identified as an initial bias control word for the negative half-cell 112 of the m=1 amplifier cell. The bias control word that produces a negative half-cell output for the negative half-cell 112 of the m=2 amplifier cell 110 matching that of the reference-biased positive half-cell 114 (of the m=1 amplifier cell 110) when all other negative half-cells are inactive is identified as an initial bias control word for the negative half-cell 112 of the m=2 amplifier cell 110. This process continues until the initial bias control word is determined for each negative half-cell 112.

The bias calibration circuit 520 generates the positive and negative half-cell bias tables based on the corresponding optimal and initial bias control words (block 630). For example, bias calibration circuit 520 generates a bias control word for the positive half-cell 112 of each amplifier cell 110 based on the optimal bias control word and each of the initial bias control words determined for all of the positive half-cells 112. Similarly, bias calibration circuit 520 generates a bias control word for the negative half-cell 114 of each amplifier cell 110 based on the optimal bias control word and each of the initial bias control words determined for all of the negative half-cells 114.

For example, the bias calibration circuit 520 may generate the bias control word for the positive half-cell 112 of the $m^{th}$ amplifier cell $110_m$ according to:

$$BCW_p(m) = BCW_{init,p}(m) + BCW_{opt,p} - \frac{1}{M}\sum_{m=1}^{M} BCW_{init,p}(m), \quad (3)$$

where $BCW_{init,p}(m)$ represents the initial positive half-cell bias control word determined for the $m^{th}$ amplifier cell $110_m$, and $BCW_{opt,p}$ represents the optimal bias control word determined for the positive half-cells 112. Similarly, the bias calibration circuit 520 may generate the bias control word for the negative half-cell 114 of the $m^{th}$ amplifier cell $110_m$ according to:

$$BCW_n(m) = BCW_{init,n}(m) + BCW_{opt,n} - \frac{1}{M}\sum_{m=1}^{M} BCW_{init,n}(m) \quad (4)$$

where $BCW_{init,n}(m)$ represents the initial negative half-cell bias control word determined for the $m^{th}$ amplifier cell $110_m$, and $BCW_{opt,n}$ represents the optimal bias control word determined for the negative half-cells 114.

Figure 6:
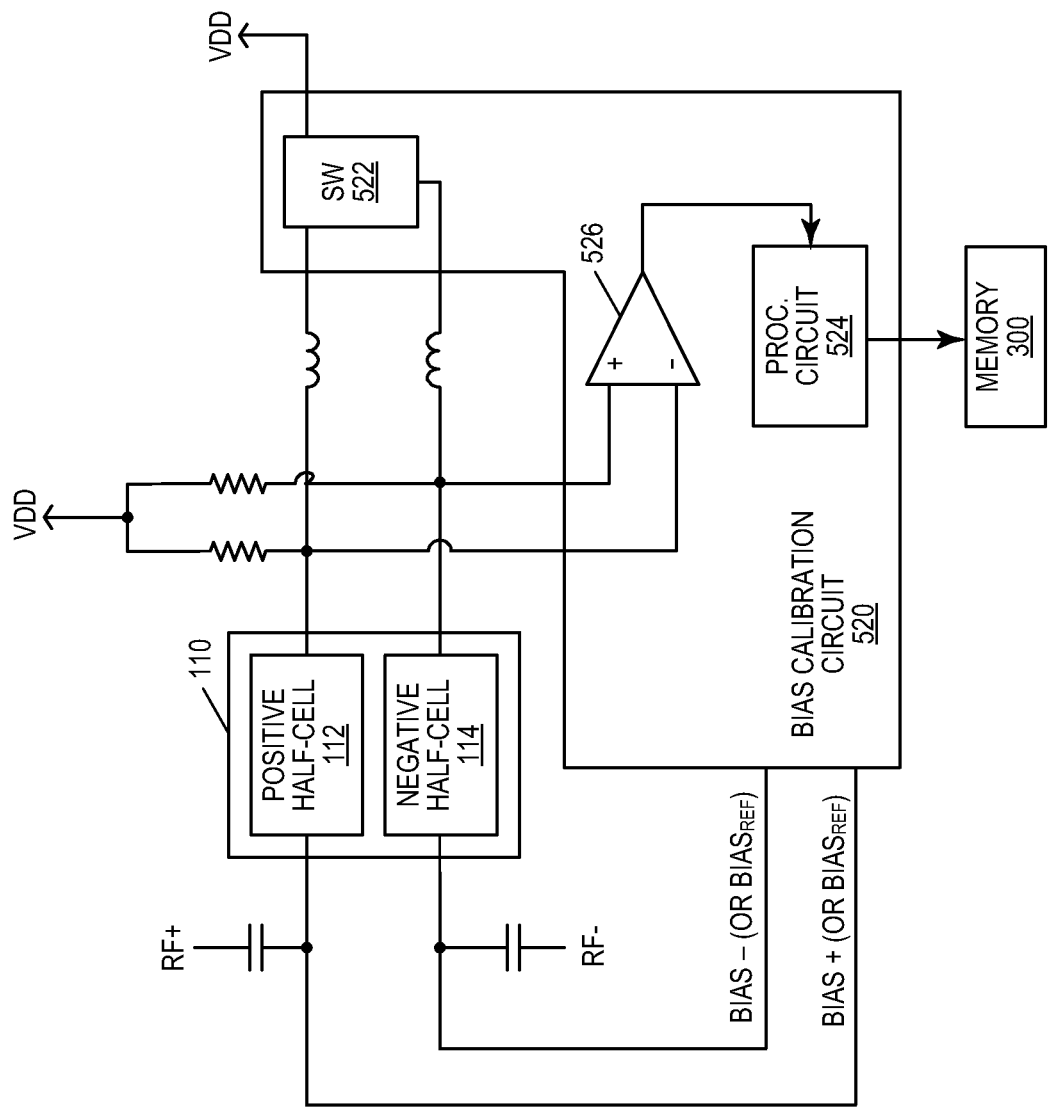
FIG. 6 shows a block diagram of a bias calibration circuit according to one exemplary embodiment.

FIG. 6 shows an exemplary block diagram for the bias calibration circuit 520 when determining the initial bias control words for the positive and negative half-cells of one of the amplifier cells 110 according to FIG. 5B. Bias calibration circuit 520 comprises a switch 522, processing circuit 524, and comparator 526. While switch 522 is shown as being part of the bias calibration circuit 520 in FIG. 6, it will be appreciated that it may simply be part of the amplifier cell circuitry. During the operational phase, switch 522 is closed to tie the half-cell outputs together and to a supply voltage VDD. When determining the bias control word for each half-cell, however, bias calibration circuit 520 opens switch 522 to disconnect the half-cell outputs from each other and from VDD. It will be appreciated that switch 522 is not limited to a single switch, but may represent any number of switches necessary to make the desired connections. Processing circuit 524 biases one of the half-cells 112, 114 of one amplifier cell 110 according to a reference bias control word while stepping the other half-cell 114, 112 of the amplifier cells 110 (when only one is active at a time) through a series of bias control words. Comparator 526 compares the output generated by the half-cell 112, 114 biased according to the reference bias control word with the output generated by the other half-cell 114, 112 biased according to one of the possible bias control words. Processing circuit 524 evaluates the comparator outputs to identify the initial bias control word producing the half-cell output matching that of the half-cell 112, 114 biased according to the reference bias control word, and stores the identified initial bias control word either in a temporary memory (not shown) associated with the processing circuit 524 or in memory 300. The bias calibration circuit 520 repeats these operations for each of the other half-cells 114, 112.

When the PA array 100 comprises In-phase and Quadrature amplifier cells 110, each having a positive half-cell 112 and a negative half-cell 114, the above-described process is separately performed for the In-phase and Quadrature amplifier cells 110 to produce a positive half-cell In-phase bias table, a negative half-cell In-phase bias table, a positive half-cell Quadrature bias table, and a negative half-cell Quadrature bias table. If the PA array 100 does not have different types of amplifier cells, however, the above-described process is performed to produce a positive half-cell bias table and a negative half-cell bias table.

While the above describes the determination of the bias control words stored in the bias tables 310 during a calibration phase that occurs before an operational phase, it will be appreciated that the calibration circuit 500 may additionally adjust the bias control words determined during the calibration phase by determining one or more new bias control words for each bias table 310 during the operational phase. When the calibration circuit 500 determines a new bias control word during the operational phase, the calibration circuit 500 replaces the predetermined bias control word (determined during the calibration phase) with the new bias control word in the appropriate table 310. In so doing, the calibration circuit 500 may account/adjust for environmental/temperature/lifetime effects on the amplifier cells 110, and therefore, may improve the linearity and efficiency of the amplifier cells 110. For example, as a high output circuit ages or experiences high temperatures, the junction temperature of one or more of the transistors in the circuit may increase sufficiently to cause a new mismatch. The calibration circuit 500 may then be used to determine a new bias control word for the affected circuit(s) during non-operational times of the circuit, e.g., during non-transmission times of an amplifier circuit.

Figure 7:
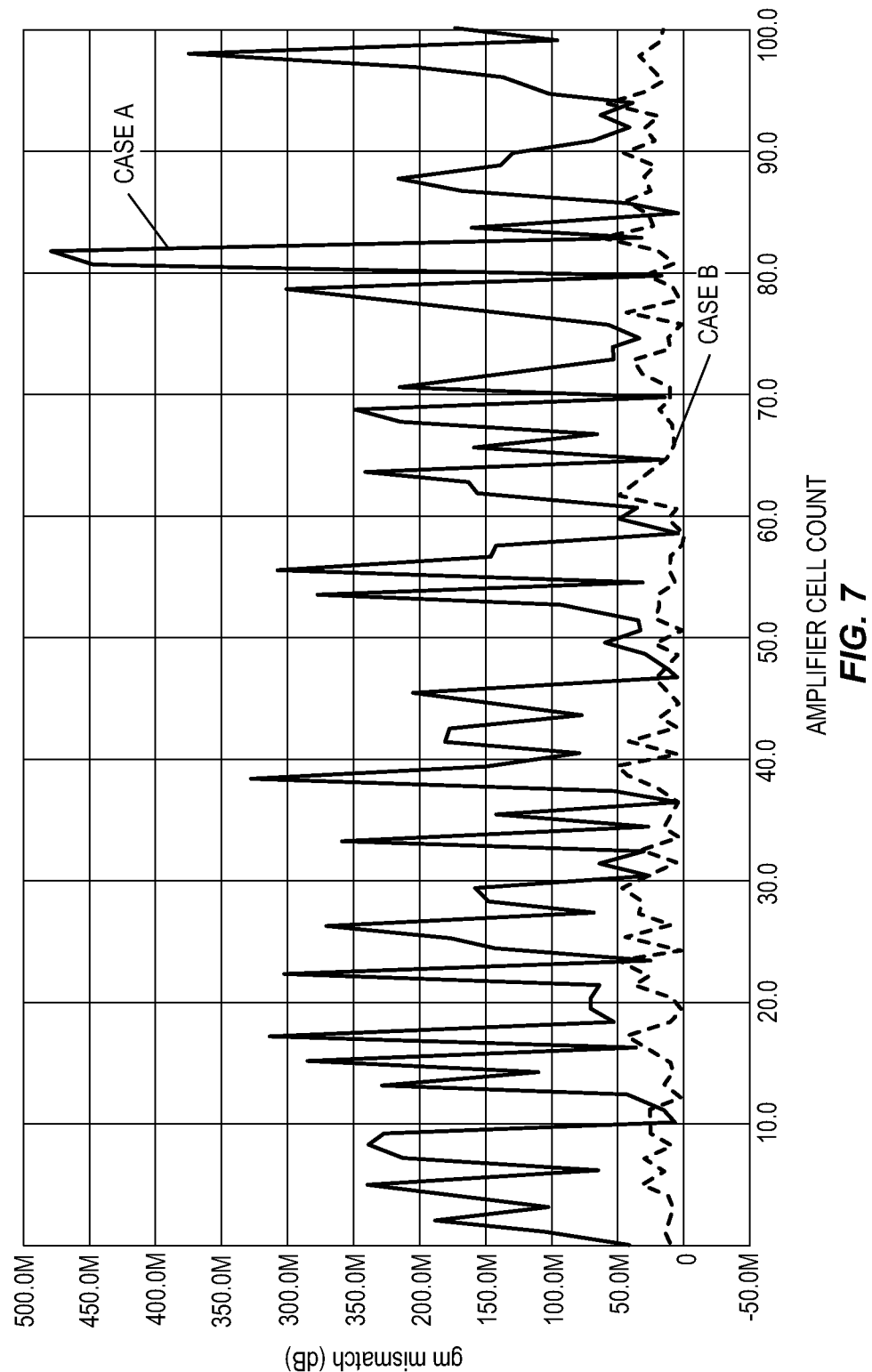
FIG. 7 shows simulation results of the gain mismatch when the calibration solution presented herein is used versus when it is not used.
Figure 8A:
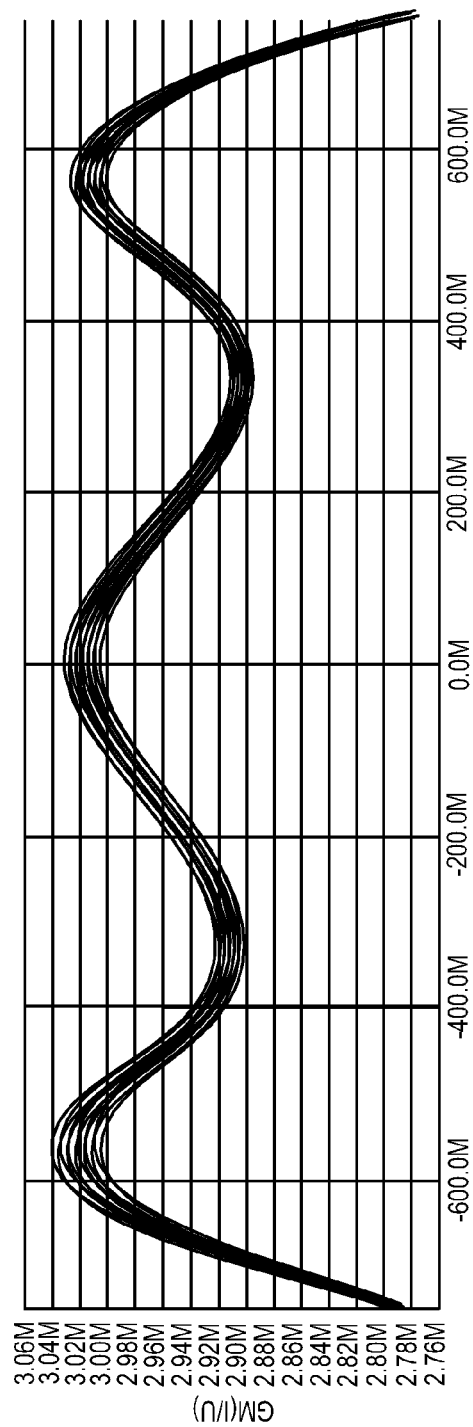
FIGS. 8A and 8B show simulation results of the linearity when the calibration solution presented herein is used versus when it is not used.
Figure 8B:
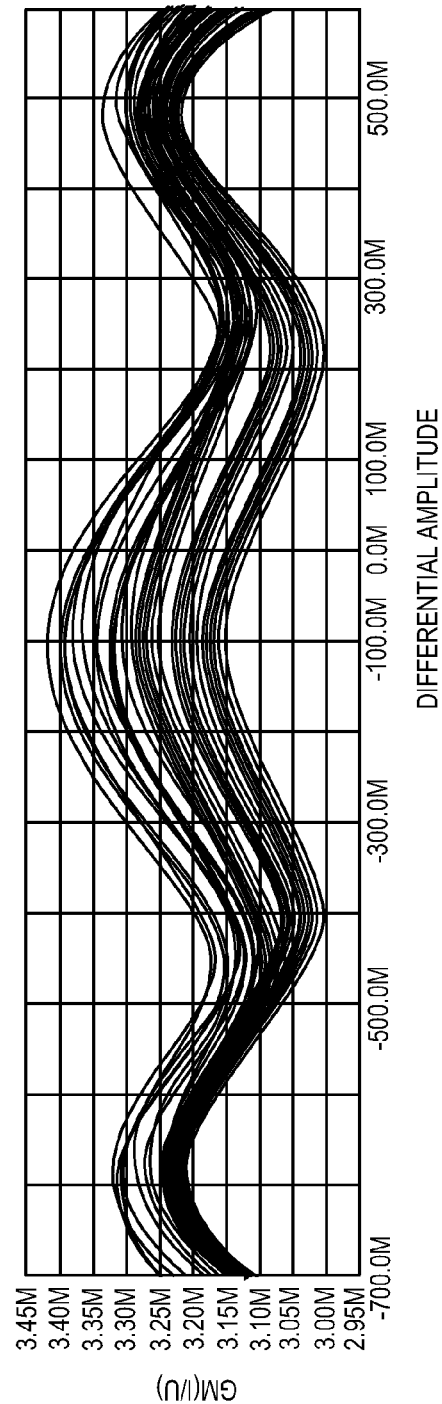

FIGS. 7 and 8A-8B show simulation results that illustrate the benefits of the solution disclosed herein. FIG. 7 show the maximum gain mismatch between two amplifier cells 110 when the calibration solution disclosed herein is not used (Case A) versus when it is used (Case B). As shown by FIG. 7, the calibration solution disclosed herein significantly reduces the gain mismatch, e.g., by 0.2-0.5 dB.

FIGS. 8A and 8B show the linearity achieved when the solution is used (FIG. 8A) versus when it is not used (FIG. 8B) by plotting the differential transconductance for both cases across a large RF input signal range. In both figures, each line represents the linearity associated with a different number of active amplifier cells 110. As shown in FIG. 8A, the linearity achieved using the solution presented herein remains uniform regardless of the number of active amplifier cells 110, which is not true for the simulation shown in FIG. 8B, which applies the same bias voltage regardless of the number of active amplifier cells 110. Thus, the solution presented herein improves the efficiency and linearity of a PA array regardless of the number of active amplifier cells 110.

Various elements disclosed herein are described as some kind of circuit, e.g., a bias circuit 200, configuration circuit 210, selection circuit 220, calibration circuit 500, optimization circuit 510, bias calibration circuit 520, processing circuit 524, etc. Each of these circuits, as well as PA array 100, amplifier cells 110, switch 522, and comparator 526 may be embodied in hardware and/or in software (including firmware, resident software, microcode, etc.) executed on a controller or processor, including an application specific integrated circuit (ASIC). Further, memory 300 may comprise any type of known memory, including but not limited to a random access memory (RAM), a read-only memory (ROM), an erasable programmable read-only memory (EEPROM or Flash memory), etc.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:
1. A method of reducing gain step error and improving linearity of a plurality of power amplifiers, the method comprising:
 identifying which one or more of the plurality of power amplifiers are active during an operational phase of the plurality of power amplifiers;
 selecting a bias control word corresponding to each identified active power amplifier from a bias table, the bias table comprising a bias control word for each power amplifier;
 averaging the selected bias control words to determine an input bias control word; and
 biasing an input stage of each active power amplifier according to the input bias control word;
 wherein an operational point of each power amplifier during the operational phase is set such that an average amplifier current increases with increasing amplitude of an RF signal applied to the input stage of the power amplifier.

2. The method of claim 1 wherein predetermined bias control words determined during a calibration phase occurring before the operational phase are stored in the bias table.

3. The method of claim 2 method further comprising:
determining a new bias control word for one or more of the power amplifiers during the operational phase; and
replacing the predetermined bias control word in the bias table with the corresponding new bias control word.

4. The method of claim 1 wherein each power amplifier comprises a first half-cell and a second half-cell:
wherein selecting the bias control word comprises:
selecting a first bias control word corresponding to the first half-cell of each identified active power amplifier from a first half-cell bias table, the first half-cell bias table comprising a first bias control word for the first half-cell of each of the plurality of power amplifiers; and
selecting a second bias control word corresponding to the second half-cell of each identified active power amplifier from a second half-cell bias table, the second half-cell bias table comprising a second bias control word for the second half-cell of each of the plurality of power amplifiers;
wherein averaging the selected bias control words comprises:
averaging the selected first bias control words to determine a first half-cell input bias control word; and
averaging the selected second bias control words to determine a second half-cell input bias control word; and
wherein biasing the input stage of each active power amplifier comprises:
biasing a first input stage of the first half cell of each active power amplifier according to the first half-cell input bias control word; and
biasing a second input stage of the second half cell of each active power amplifier according to the second half-cell input bias control word.

5. The method of claim 1 further comprising generating the bias table based on an optimal bias control word and an initial bias table, said optimal bias control word optimizing a linearity of the plurality of power amplifiers when all power amplifiers are active, and said initial bias table comprising an initial bias control word for each power amplifier determined when only that power amplifier is active.

6. A bias circuit for reducing a gain step error and improving a linearity of a plurality of power amplifiers, the bias circuit comprising:
a configuration circuit configured to identify which one or more of the plurality of power amplifiers are active during an operational phase of the plurality of power amplifiers; and
a selection circuit configured to:
select a bias control word corresponding to each identified active power amplifier from a bias table, the bias table stored in a memory operatively connected to the bias circuit and comprising a bias control word for each power amplifier;
average the selected bias control words to determine an input bias control word; and
bias an input stage of each active power amplifier according to the input bias control word;
wherein an operational point of each power amplifier during the operational phase is set such that an average amplifier current increases with increasing amplitude of an RF signal applied to the input stage of the power amplifier.

7. The bias circuit of claim 6 wherein each power amplifier comprises a first half-cell and a second half-cell:
wherein the selection circuit selects the bias control word by:
selecting a first bias control word corresponding to the first half-cell of each identified active power amplifier from a first half-cell bias table, the first half-cell bias table comprising a first bias control word for the first half-cell of each of the plurality of power amplifiers; and
selecting a second bias control word corresponding to the second half-cell of each identified active power amplifier from a second half-cell bias table, the second half-cell bias table comprising a second bias control word for the second half-cell of each of the plurality of power amplifiers;
wherein the selection circuit averages the selected one or more bias control words by:
averaging the selected one or more first bias control words to determine a first half-cell input bias control word; and
averaging the selected one or more second bias control words to determine a second half-cell input bias control word; and
wherein the selection circuit biases the input stage of each active power amplifier by:
biasing a first input stage of the first half cell of each active power amplifier according to the first half-cell input bias control word; and
biasing a second input stage of the second half cell of each active power amplifier according to the second half-cell input bias control word.

8. An amplifier system comprising:
a plurality of power amplifiers, wherein an operational point of each power amplifier during an operational phase is set such that an average amplifier current increases with increasing amplitude of an RF signal applied to an input stage of the power amplifier;
a memory configured to store a bias table comprising a bias control word for each of the plurality of power amplifiers; and
a bias circuit configured to reduce a gain step error and improve a linearity of the plurality of power amplifiers, the bias circuit comprising:
a configuration circuit configured to identify which one or more of the plurality of power amplifiers are active during the operational phase of the plurality of power amplifiers; and
a selection circuit configured to:
select the bias control word corresponding to each identified active power amplifier from the bias table;
average the selected one or more bias control words to determine an input bias control word; and
bias an input stage of each active power amplifier according to the input bias control word.

9. The amplifier system of claim 8 further comprising a calibration circuit configured to:
determine a new bias control word for one or more of the power amplifiers during the operational phase; and
replace the bias control word in the bias table with the corresponding new bias control word.

10. The amplifier system of claim 8 wherein each power amplifier comprises a first half-cell and a second half-cell:

wherein the selection circuit selects the bias control word by:
  selecting a first bias control word corresponding to the first half-cell of each identified active power amplifier from a first half-cell bias table, the first half-cell bias table comprising a first bias control word for the first half-cell of each of the plurality of power amplifiers; and
  selecting a second bias control word corresponding to the second half-cell of each identified active power amplifier from a second half-cell bias table, the second half-cell bias table comprising a second bias control word for the second half-cell of each of the plurality of power amplifiers;
wherein the selection circuit averages the selected one or more bias control words by:
  averaging the selected one or more first bias control words to determine a first half-cell input bias control word; and
  averaging the selected one or more second bias control words to determine a second half-cell input bias control word; and
wherein the selection circuit biases the input stage of each active power amplifier by:
  biasing a first input stage of the first half cell of each active power amplifier according to the first half-cell input bias control word; and
  biasing a second input stage of the second half cell of each active power amplifier according to the second half-cell input bias control word.

11. The amplifier system of claim 8 further comprising a calibration circuit configured to generate the bias table.

12. The amplifier system of claim 8:
wherein a first half of the power amplifiers comprise In-phase power amplifiers and a second half of the power amplifiers comprise Quadrature power amplifiers;
wherein the memory stores an In-phase bias table comprising a In-phase bias control word for each of the plurality of In-phase power amplifiers and a Quadrature bias table comprising a Quadrature bias control word for each of the plurality of Quadrature power amplifiers; and
wherein the selection circuit selects the In-phase bias control word corresponding to each identified In-phase active power amplifier from the In-phase bias table, and selects the Quadrature bias control word corresponding to each identified Quadrature active power amplifier from the Quadrature bias table.

* * * * *